(12) United States Patent
Heo et al.

(10) Patent No.: US 10,906,830 B2
(45) Date of Patent: Feb. 2, 2021

(54) METHOD OF PROCESSING WINDOW MEMBER

(71) Applicant: Samsung Display Co., Ltd., Yongin-si (KR)

(72) Inventors: Jinnyoung Heo, Yongin-si (KR); Jongkap Jo, Asan-si (KR); Hyoungsuk Roh, Cheonan-si (KR); Sanghee Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 209 days.

(21) Appl. No.: 16/053,432

(22) Filed: Aug. 2, 2018

(65) Prior Publication Data

US 2019/0055151 A1 Feb. 21, 2019

(30) Foreign Application Priority Data

Aug. 21, 2017 (KR) .................. 10-2017-0105685

(51) Int. Cl.
  *C03C 17/23* (2006.01)
  *C03B 23/023* (2006.01)
  *C03C 21/00* (2006.01)
  *C03C 17/25* (2006.01)
  (Continued)

(52) U.S. Cl.
  CPC ........ *C03B 23/0235* (2013.01); *C03B 23/023* (2013.01); *C03B 23/0302* (2013.01); *C03B 40/00* (2013.01); *C03C 17/007* (2013.01); *C03C 17/256* (2013.01); *C03C 17/32* (2013.01); *C03C 21/002* (2013.01); *C03C 2217/212* (2013.01); *C03C 2217/213* (2013.01); *C03C 2217/22* (2013.01); *C03C 2217/477* (2013.01); *C03C 2217/478* (2013.01); *C03C 2218/11* (2013.01); *C03C 2218/113* (2013.01); *C03C 2218/33* (2013.01); *C03C 2218/355* (2013.01); *H01L 27/323* (2013.01); *H01L 51/0097* (2013.01);
  (Continued)

(58) Field of Classification Search
  CPC ....... C03C 17/008; C03C 17/13; C03C 17/23; C03C 2217/212; C03C 2217/22; C03C 2218/328; C03C 2218/34; C03C 2218/355
  See application file for complete search history.

(56) References Cited

U.S. PATENT DOCUMENTS 5,976,678 A * 11/1999 Kawazu ............ B32B 17/10339
                                                      427/165
6,582,799 B1 * 6/2003 Brown .............. B32B 17/10036
                                                    296/190.1
(Continued)

FOREIGN PATENT DOCUMENTS

KR      10-0937262 B1      1/2010
KR      1020100130642 A    12/2010
(Continued)

*Primary Examiner* — Cynthia Szewczyk
(74) *Attorney, Agent, or Firm* — Innovation Counsel LLP

(57) ABSTRACT

A method of processing a window member according to an embodiment includes applying a protective coating agent including at least one of a siloxane derivative and an inorganic sol compound onto a glass substrate, performing a heat treatment on the applied protective coating agent to form a protective layer on the glass substrate, thermoforming the glass substrate, and removing the protective layer, so as to process the window member without degradation of optical characteristics and without surface damages of the glass substrate.

20 Claims, 10 Drawing Sheets

(51) Int. Cl.
- *C03C 17/00* (2006.01)
- *C03C 17/32* (2006.01)
- *C03B 23/03* (2006.01)
- *C03B 40/00* (2006.01)
- *H01L 51/52* (2006.01)
- *H01L 51/00* (2006.01)
- *H01L 27/32* (2006.01)

(52) U.S. Cl.
CPC .. *H01L 51/5237* (2013.01); *H01L 2251/5338* (2013.01)

(56) References Cited

U.S. PATENT DOCUMENTS

| | | | | |
|---|---|---|---|---|
| 2001/0024685 | A1* | 9/2001 | Boulton | C23C 18/122 427/162 |
| 2009/0258187 | A1 | 10/2009 | Brady et al. | |
| 2012/0052302 | A1* | 3/2012 | Matusick | C03C 17/32 428/410 |
| 2013/0183487 | A1* | 7/2013 | Henze | C03C 17/3607 428/141 |
| 2013/0260105 | A1* | 10/2013 | Lee | B32B 17/10036 428/192 |
| 2013/0330515 | A1 | 12/2013 | Oh et al. | |
| 2015/0090689 | A1 | 4/2015 | Guilfoyle et al. | |
| 2015/0114041 | A1* | 4/2015 | Capek | C03C 17/28 65/23 |

FOREIGN PATENT DOCUMENTS

| | | |
|---|---|---|
| KR | 10-1135182 B1 | 4/2012 |
| KR | 10-2012-0100287 A | 9/2012 |
| KR | 10-2013-0139106 A | 12/2013 |
| KR | 1020160060754 A | 5/2016 |

* cited by examiner

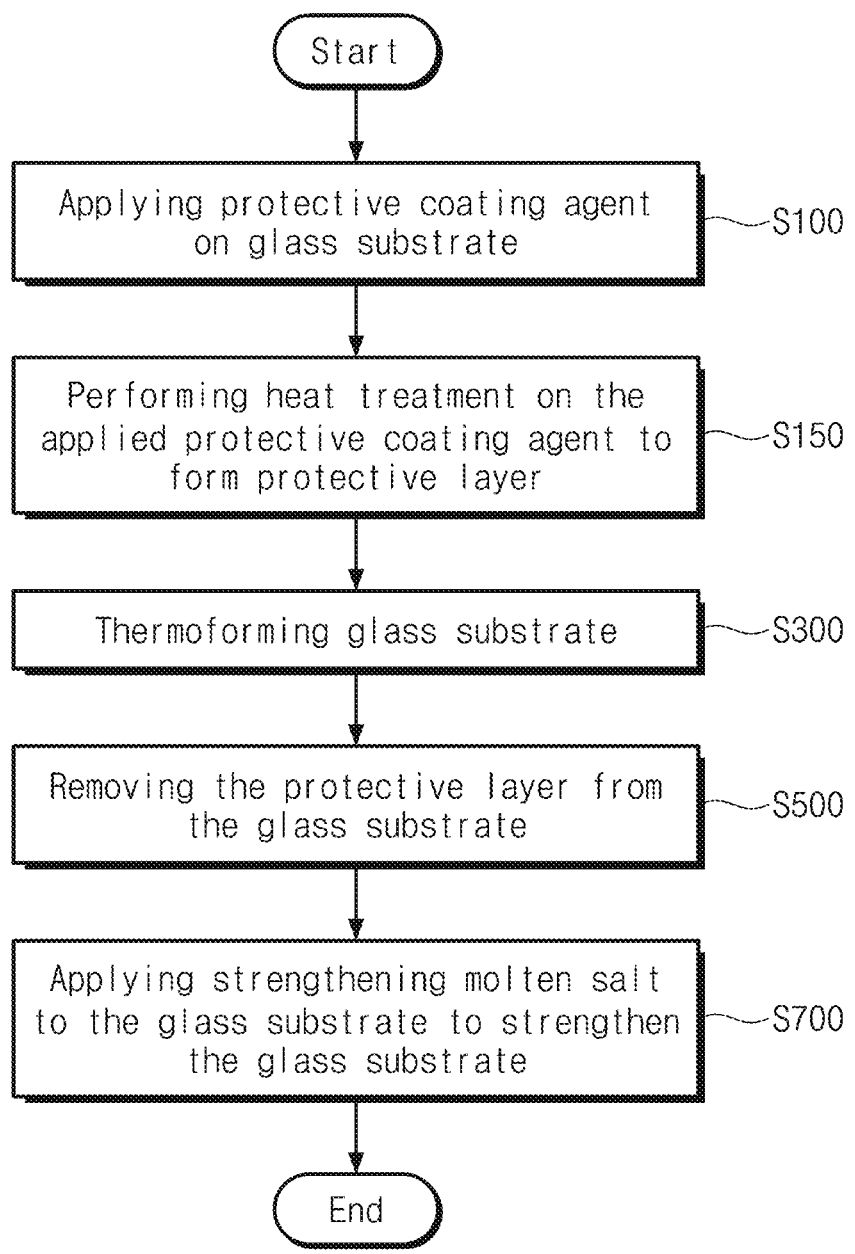

METHOD OF PROCESSING WINDOW MEMBER

CROSS-REFERENCE TO RELATED APPLICATIONS

This U.S. non-provisional patent application claims priority under 35 U.S.C. § 119 of Korean Patent Application No. 10-2017-0105685, filed on Aug. 21, 2017, the entire contents of which are hereby incorporated by reference.

BACKGROUND

The present disclosure herein relates to a method of processing a window member including a thermoforming process, and more particularly, to a method of processing a window member, in which a protective layer for protecting a surface of a glass substrate during a thermoforming process is provided.

Various types of display apparatuses are being used to provide image information. Such display apparatuses include a display module for displaying an image and a window member for protecting the display module. In particular, the window member may use a glass substrate. The window member provides an appearance and a touch surface of the display apparatus at the same time.

In recent years, a flexible display apparatus that may be varied into various shapes, e.g., a bent or folded shape, and a display apparatus having a free shape that is not standardized, e.g., a shape having a plurality of curved surfaces, are being developed. Accordingly, the window member also requires a process for processing various shapes. As described above, the window member for a display apparatus includes a glass substrate that is processed into various shapes by using the thermoforming process or the like. Thus, a method for protecting a surface of the glass substrate during the processing process of the glass substrate is demanded.

SUMMARY

The present disclosure provides a method of processing a window member providing a protective layer for protecting a surface of a glass substrate while a processing process is performed.

The present disclosure also provides a method of processing a window member capable of protecting a surface even under a processing process condition of a high-temperature and high-pressure.

Also, the present disclosure provides a method of processing a window member, from which an additional polishing process after a processing process is omittable.

An embodiment of the inventive concept provides a method of processing a window member, including: applying a protective coating agent including at least one of a siloxane derivative and an inorganic sol compound onto a glass substrate; performing a heat treatment on the applied protective coating agent to form a protective layer on the glass substrate; thermoforming the glass substrate; and removing the protective layer.

In an embodiment, the siloxane derivative may include a siloxane compound and inorganic particles bonded with the siloxane compound, and the inorganic particles may include at least one of $TiO_2$, $SiO_2$, or $ZrO_2$.

In an embodiment, the inorganic sol compound may include at least one of a $TiO_2$ sol, a $SiO_2$ sol, or a $ZrO_2$ sol.

In an embodiment, the protective coating agent may include the siloxane derivative and the inorganic sol compound, and the inorganic sol compound may be contained at about 50 wt % or more and about 90 wt % or less on the basis of a weight of the siloxane derivative.

In an embodiment, the protective coating agent may include a siloxane derivative having $SiO_2$ particles bonded thereto and a $TiO_2$ sol.

In an embodiment, the protective coating agent may further include an acrylate compound.

In an embodiment, the applying of the protective coating agent may be performed by using a method of screen printing, dip coating, spin coating, bar coating, or slot-die coating.

In an embodiment, the forming of the protective layer may include thermally-curing the protective coating agent.

In an embodiment, the protective layer may be provided on top and bottom surfaces of the glass substrate.

In an embodiment, the forming of the protective layer may include forming a first sub-protective layer on the glass substrate and forming a second sub-protective layer on the first sub-protective layer, and the first sub-protective layer and the second sub-protective layer may be formed by using the protective coating agents having compositions different from each other.

In an embodiment, the protective layer has a thickness of about 10 µm or more and about 30 µm or less.

In an embodiment, the thermoforming of the glass substrate may be performed under a temperature of about 700° C. or more.

In an embodiment, the thermoforming of the glass substrate may include applying a pressure to the glass substrate.

In an embodiment, the removing of the protective layer may be performed by applying a strong alkaline solution to the thermoformed glass substrate.

In an embodiment, the removing of the protective layer may be performed by applying a KOH solution, a NaOH solution, or a tetramethylammonium hydroxide (TMAH) solution to the thermoformed glass substrate.

In an embodiment, the method may further include cutting the glass substrate, and the cutting of the glass substrate may be performed before the applying of the protective coating agent or after the forming of the protective layer.

In an embodiment, the method may further include strengthening the glass substrate after the removing of the protective layer.

In an embodiment of the inventive concept, a method of processing a window member includes: applying a protective coating agent including at least one of a siloxane derivative and an inorganic sol compound onto a glass substrate; thermally-curing the applied protective coating agent to form a protective layer on the glass substrate; thermoforming the glass substrate so that the glass substrate includes at least one curved portion; and removing the protective layer.

In an embodiment, the siloxane derivative may include a siloxane compound and at least one inorganic particle bonded with the siloxane compound and selected from the group consisting of $TiO_2$, $SiO_2$, or $ZrO_2$, and the inorganic sol compound may include at least one of a $SiO_2$ sol, a $TiO_2$ sol, or a $ZrO_2$ sol.

In an embodiment, the thermoforming of the glass substrate may include applying a pressure to the glass substrate under a temperature of about 700° C. or more.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 7 is a flowchart illustrating a method of processing a window member according to an embodiment.

DETAILED DESCRIPTION

Figure 1:
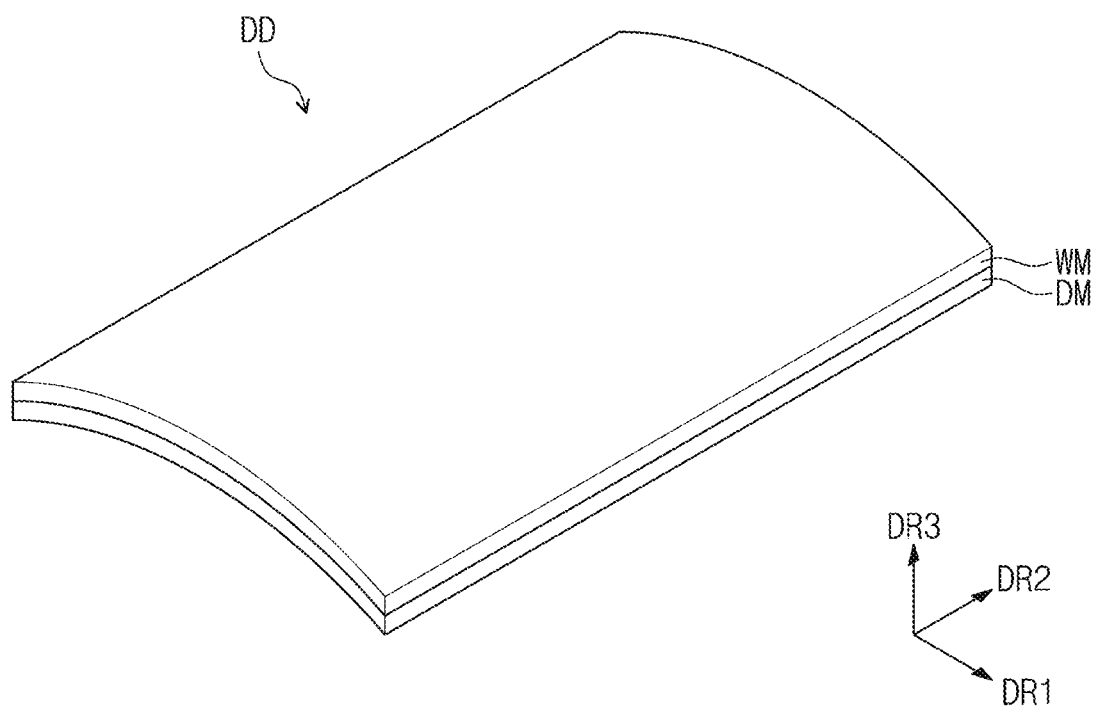
FIG. 1 is a perspective view illustrating a display apparatus including a window member manufactured by a method of processing a window member according to an embodiment.

Since the present disclosure may have diverse modified embodiments, specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the present disclosure.

Like reference numerals refer to like elements throughout. In the drawings, the dimensions and size of each structure are exaggerated, omitted, or schematically illustrated for convenience in description and clarity. It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

The meaning of 'include' or 'comprise' specifies a property, a region, a fixed number, a step, a process, an element and/or a component but does not exclude other properties, regions, fixed numbers, steps, processes, elements and/or components.

In the specification, it will be understood that when a layer (or film), a region, or a plate is referred to as being 'on' another layer, region, or plate, it can be directly on the other layer, region, or plate, or intervening layers, regions, or plates may also be present. Further, it will be understood that when a layer, a film, a region, or a plate is referred to as being 'under' another layer, region, or plate, it can be directly under the other layer (or film), region, or plate, or intervening layers, regions, or plates may also be present. In the description of embodiments, it will be understood that when a portion such as a layer, a film, a region, or a plate is referred to as being 'on/over' another portion, it can be disposed on the another portion or disposed below the another portion.

Hereinafter, a method of processing a window member according to an embodiment of the inventive concept will be described with reference to the drawings.

FIG. 1 is a perspective view of a display apparatus DD including a window member WM that is processed by a method of processing a window member according to an embodiment. The display apparatus DD in FIG. 1 may include a display module DM and the window member WM disposed on the display module DM. The display module DM may generate an image and provide the generated image to a front surface that is in a third direction DR3 in FIG. 1. The display module DM may be flexible. The third direction DR3 is perpendicular to a plane defined by the first and second directions DR1 and DR2.

The display module DM may include a display panel and functional members. For example, the display panel may include an organic electroluminescence display panel, a liquid crystal display panel, an electronic ink display panel, an electrowetting display panel, and an electrophoretic display panel. The display panel may be flexible. However, an embodiment of the inventive concept is not limited thereto. For example, the display panel may be rigid.

The display module DM may include at least one of a protective film, an input sensing unit, and an optical member as functional members. However, an embodiment of the inventive concept is not limited thereto. For example, the display module DM may further include additional functional members in addition to the above-described members. Each of the functional members may have a flexible property. The protective film may protect the display panel from an external impact. The optical member may include a polarizer, a light compensation layer, and a retarder. The input sensing unit may include, e.g., a touch sensing unit. However, an embodiment of the inventive concept is not limited thereto. For example, the input sensing unit may include a capacitance type or an electromagnetic induction type touch sensing unit. The functional members may be disposed on the display panel.

The display panel and the functional members may be coupled through an optical clear adhesive (OCA) in the display module DM. However, an embodiment of the inventive concept is not limited thereto. For example, one of the functional members may be directly provided on another functional member disposed adjacent thereto.

The window member WM may be disposed on the display module DM. The window member WM may be disposed on the display module DM to serve as a protective substrate for protecting the display module DM. Also, the window member WM may constitute a front surface of the display apparatus DD to provide an input surface/touch surface/display surface for inputting information by a user. The window member WM may be flexible. Also, although not shown in the drawings, an optical clear adhesive may be further provided between the display module DM and the window member WM.

Meanwhile, although the display apparatus having a curved surface protruding in the third direction DR3 in which an image is provided is illustrated in FIG. 1, an embodiment of the inventive concept is not limited thereto. For example, the display surface, on which an image is provided, of the display apparatus DD may be a recessed curved surface or include at least one planar part and at least one curved part.

Also, the window member WM may have a shape of a curved surface protruding in the third direction DR3 in correspondence to that of the display apparatus DD. Also, unlike FIG. 1, the window member may have a recessed curved surface or a plurality of curved surfaces. According to an embodiment, the window member WM may be processed to have various curved surfaces by using a thermoforming process.

The display apparatus DD including the window member WM that is processed to have various shapes may be used for a portable terminal, a vehicle navigation, and a personal display inside a vehicle.

Figure 2:
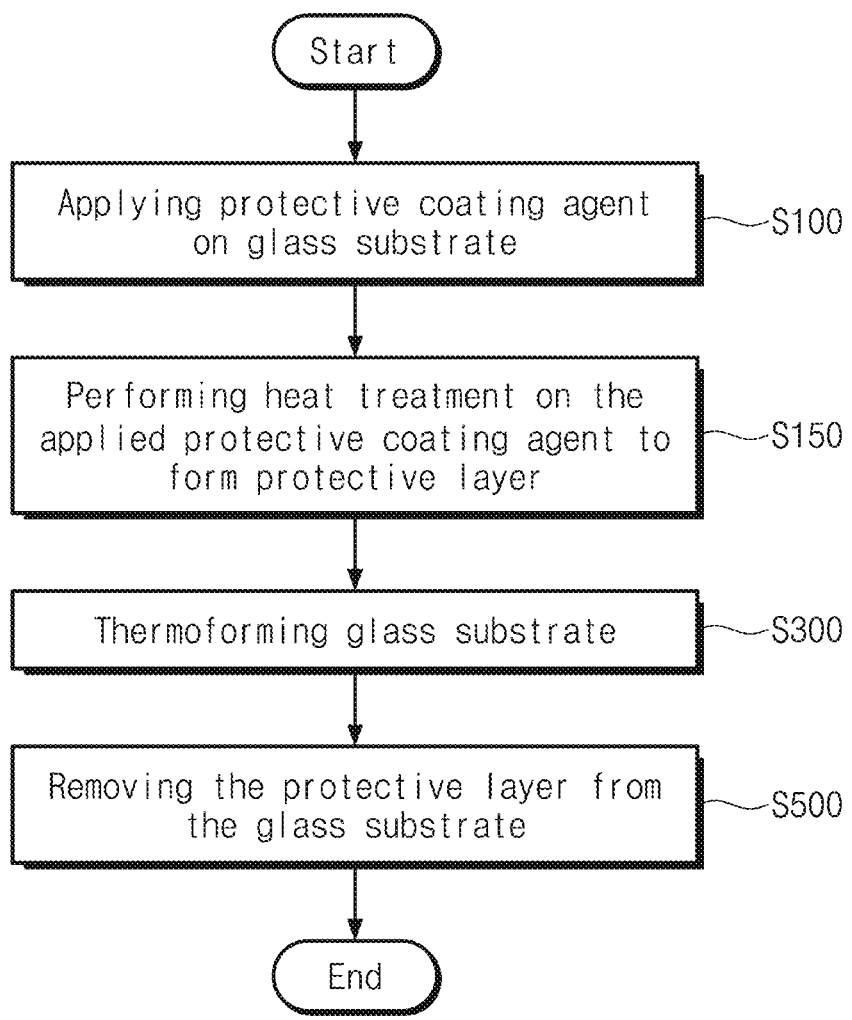
FIG. 2 is a flowchart illustrating a method of processing a window member according to an embodiment.

FIG. 2 is a flowchart illustrating a method of processing the window member WM according to an embodiment. FIGS. 3A to 3D are schematic views respectively illustrating operations of a method of processing the window member WM according to an embodiment.

Referring to FIG. 2, a method of processing the window member WM according to an embodiment may include an operation S100 of applying a protective coating agent onto a glass substrate, an operation S150 of forming a protective layer on the glass substrate, an operation S300 of thermoforming the glass substrate, and an operation S500 of removing the protective layer. The operation S100 of applying a protective coating agent onto the glass substrate may represent an operation of applying a protective coating agent PS on a glass substrate BS that is a base substrate. Although an operation of applying the protective coating agent PS by using a dip coating method is exemplarily illustrated in FIG. 3A, an embodiment of the inventive concept is not limited thereto. For example, the operation S100 of applying the protective coating agent PS onto the glass substrate BS may be performed by using a screen printing method, a spin-coating method, a bar coating method, and a slot-die coating method in addition to the dip coating method. Meanwhile, although not exemplarily described, the protective coating agent PS may be applied onto the glass substrate BS by using well known various coating methods.

Meanwhile, when the protective coating agent PS is applied onto the glass substrate BS by using the dip coating method, a protective layer PL (FIG. 3B) covering the entire glass substrate BS may be formed by a single coating process. Also, when the protective coating agent PS is applied onto the glass substrate BS by using a screen printing method, the protective layer PL (FIG. 3B) having a sufficient thickness may be formed on the glass substrate BS to form the protective layer PL (FIG. 3B) having an excellent durability during the process for processing the window member.

The glass substrate BS on which the protective coating agent PS is applied may be a flat substrate. That is, the glass substrate BS may be provided in a flat state before the forming process is performed. Meanwhile, the glass substrate BS may be a mother glass that is in a flat state before a cutting process is performed or a cut glass that is in a flat state after the mother glass is cut. That is, the operation of applying the protective coating agent PS onto the glass substrate BS may be performed before or after the cutting process is performed. That is, the process of cutting the glass substrate BS may be performed before the operation S100 of applying the protective coating agent or after the operation S150 of forming the protective layer.

Meanwhile, the cutting process may include a process of defining holes having various shapes, which are necessary to the display apparatus, in the glass substrate as well as a process of cutting the mother glass into a cut glass cut suitable for a purpose.

The protective coating agent PS may include at least one of a siloxane derivative or an inorganic sol compound. For example, the protective coating agent PS may include both of the siloxane derivative and the inorganic sol compound or include one of the siloxane derivative and the inorganic sol compound. In detail, the protective coating agent PS may include only the inorganic sol compound without including the siloxane derivative.

The siloxane derivative contained in the protective coating agent PS may include a siloxane compound and inorganic particles bonded to the siloxane compound. For example, the siloxane derivative may be a siloxane copolymer in which the siloxane compound and the inorganic particles are chemically bonded with each other. In detail, the siloxane derivative may be a siloxane copolymer in which the siloxane compound and the inorganic particles are integrated with each other.

The siloxane derivative may include at least one of $SiO_2$, $TiO_2$, or $ZrO_2$, which are inorganic particles. The siloxane compound that constitutes the siloxane derivative may include a siloxane polymer or a siloxane oligomer. For example, the siloxane derivative may include a siloxane compound including inorganic particles of $SiO_2$, a siloxane compound including inorganic particles of $TiO_2$, and a siloxane compound including inorganic particles of $ZrO_2$.

An inorganic sol may represent inorganic particles in a sol state. The inorganic sol may be in state in which inorganic particles are dispersed in a monomer that is a base. For example, the inorganic sol may include at least one selected from the group consisting of a $SiO_2$ sol, a $TiO_2$ sol, or a $ZrO_2$ sol.

For example, the inorganic sol may use a siloxane-based monomer or an acryl-based monomer as a base. In detail, the monomer that is used as the base of the inorganic sole may include an acrylic siloxane monomer, a polyfunctional acrylate monomer (e.g., three-functional acrylate monomer), or a pentaerylthritol triacrylate (PETA) monomer.

Meanwhile, although the acrylic siloxane monomer may use a base monomer of $ZrO_2$ sol, three-functional acrylate monomer may use a base monomer of $TiO_2$ sol, and the PETA monomer may use a base monomer of $SiO_2$ sol, an embodiment of the inventive concept is not limited thereto.

The protective coating agent PS used in a method of processing the window member according to an embodiment may include all of a siloxane compound and inorganic sol. For example, the protective coating agent PS may include a siloxane compound including inorganic particles of $SiO_2$ and a $TiO_2$ sol. Alternatively, the protective coating agent PS may include a siloxane compound including inorganic particles of $SiO_2$ and a $ZrO_2$ sol or a $SiO_2$ sol. Also, according to an embodiment, the protective coating agent PS may include a siloxane compound including inorganic particles of $ZrO_2$ and a $ZrO_2$ sol or a siloxane compound including inorganic particles of $ZrO_2$ and a $ZrO_2$ sol and a $SiO_2$ sol.

Meanwhile, an embodiment of the inventive concept is not limited to the above-described constitution of the protective coating agent PS. For example, the protective coating agent PS may be provided with various combinations of the siloxane compound to which the inorganic particles are bonded and the inorganic sol compound. For example, the protective coating agent PS may include a plurality of siloxane derivatives that are different from each other or a plurality of inorganic sol compounds that are different from each other. Also, the protective coating agent PS may include at least one siloxane derivative and at least one inorganic sol compound selected from the group consisting of the plurality of siloxane derivatives and the plurality of inorganic sol compounds.

According to an embodiment, the protective coating agent PS may include all of the siloxane derivative and the inorganic sol compound, and the inorganic sol compound may be contained at about 50 wt % or more and about 90 wt % or less on the basis of a weight of the siloxane derivative. When the inorganic sol compound is contained at less than about 50 wt %, the protective layer PL formed of the protective coating agent PS may decrease in thermal resistance. Also, when the inorganic sol compound is contained at greater than 90 wt %, an attaching force of the protective layer PL with respect to the glass substrate BS may decrease.

According to an embodiment, the protective coating agent PS may further include an organic compound. The protective coating agent PS used in the method of processing the window member according to an embodiment may further include an acrylate compound. For example, the protective coating agent PS may further include a urethane acrylate oligomer. In detail, the protective coating agent PS may include at least one of a siloxane derivative or an inorganic sol compound and further include an acrylate compound. The protective coating agent PS may include all of a siloxane derivative, an inorganic sol compound, and an acrylate compound. According to an embodiment, the protective coating agent PS may further include an organic compound to increase the attaching force of the protective coating agent PS with respect to the glass substrate BS and improve a buffering force of the protective layer PL.

The protective coating agent PS may further include an initiator. The protective coating agent PS may further include the initiator to form the protective layer PL (FIG. 3B) on the glass substrate BS by using a thermal curing process. The protective coating agent PS may further include butyl titanate as the initiator.

Meanwhile, the protective coating agent PS may further include inorganic particles in a form of powder. The protective coating agent PS may further include at least one of $SiO_2$ particles, $TiO_2$ particles, or $ZrO_2$ particles. The protective coating agent PS may further include inorganic particles to increase a surface hardness thereof.

The protective coating agent PS may further include a well-known additive. For example, the protective coating agent PS may further include a dispersant, a leveling agent, and a surfactant. In detail, the protective coating agent PS may include well-known additives to increase compatibility of the inorganic particles and improve a coating property with respect to the glass substrate.

Referring to the flowchart in FIG. 2, the method of processing the window member according to an embodiment may include the operation S150 of performing heat-treatment on the applied protective coating agent to form a protective layer. The process of performing heat-treatment on the protective coating agent PS applied on the glass substrate BS may form the protective layer PL that is solidified on the glass substrate BS by thermally curing the protective coating agent PS. The heat treatment may be performed under a high temperature equal to or greater than about 200° C. For example, the protective coating agent PS applied on the glass substrate BS may be heat-treated for about 30 minutes at a temperature of about 200° C. to form the protective layer PL.

The protective layer PL may be disposed on both top and bottom surfaces of the glass substrate BS. Also, the protective layer PL may be disposed to surround an exposed side surface of the glass substrate BS.

The protective layer PL may be disposed to surround an exposed surface of the glass substrate BS to prevent the surface of the glass substrate BS from being damaged in the following operations of the method of processing the window member.

The protective layer PL may have a thickness equal to or greater than about 10 μm and equal to or less than about 30 μm. Meanwhile, the thickness of the protective layer PL may represent a mean thickness of the protective layer PL formed on the glass substrate BS. When the thickness of the protective layer PL is less than about 10 μm, a strength for protecting the surface of the glass substrate BS in the processing operations of the method of processing the window member may not be maintained. That is, when the thickness of the protective layer PL is less than about 10 μm, a mold mark of a pressing jig (FIG. 3B) or a support plate (FIG. 3B) of equipment used during the thermoforming process may be directly transferred to the window member.

Also, when the thickness of the protective layer PL is greater than about 30 μm, a portion of the protective layer PL may be transferred to the mold for thermoforming.

Figure 5A:
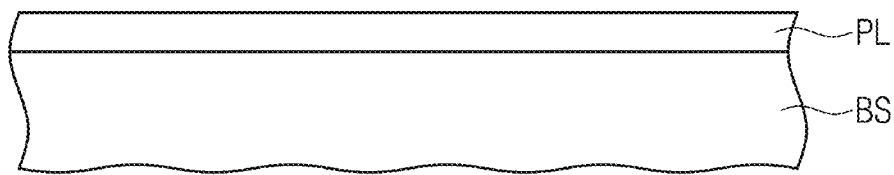
FIGS. 5A and 5B are views illustrating a portion of a cross-section of a window member including a protective layer.
Figure 5B:
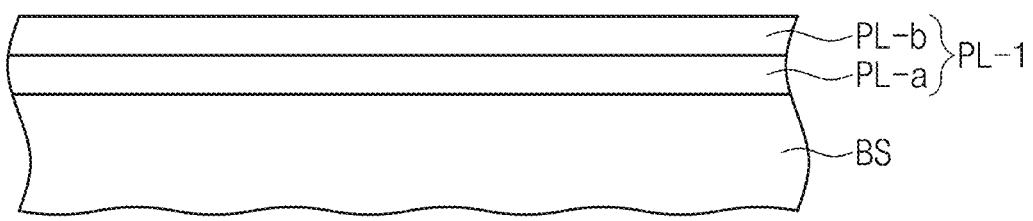

The protective layer PL may be formed on the glass substrate BS as a single layer. Also, according to an embodiment, the protective layer PL may be formed on the glass substrate BS as a plurality of layers. FIGS. 5A and 5B are cross-sectional views exemplarily illustrating a portion of the substrate BS on which the protective layer PL is formed. FIG. 5A illustrates that the protective layer PL is provided on the glass substrate BS as a single layer, and FIG. 5B illustrates that a protective layer PL-1 is provided on the glass substrate BS as two layers.

Referring to FIG. 5B, the protective layer PL-1 may include a first sub-protective layer PL-a that is adjacent to the glass substrate BS and a second sub-protective layer PL-b disposed on the first sub-protective layer PL-a. The first sub-protective layer PL-a and the second sub-protective layer PL-b may be protective layers having materials different from each other. The first sub-protective layer PL-a and the second sub-protective layer PL-b may have different hardness and decomposition temperatures from each other. In detail, the first sub-protective layer PL-a may have a buffering performance greater than that of the second sub-protective layer PL-b. Also, the second sub-protective layer PL-b may have a surface hardness and a heat resistance greater than those of the first sub-protective layer PL-a. Meanwhile, an adhesion force of the first sub-protective layer PL-a with respect to the glass substrate BS may be adjusted so that the protective layer PL-1 is easily detached from the glass substrate BS after the thermoforming process.

The first sub-protective layer PL-a and the second sub-protective layer PL-b may be formed by using the protective coating agents PS different from each other. The first sub-protective layer PL-a and the second sub-protective layer PL-b may be formed by using the protective coating agents PS having compositions different from each other. For example, the first sub-protective layer PL-a and the second sub-protective layer PL-b may be respectively formed by using the protective coating agents PS including inorganic sols different from each other. For example, the first sub-protective layer PL-a and the second sub-protective layer PL-b may be respectively formed by using the siloxane derivatives including inorganic particles different from each other.

Referring to FIG. 2 again, the method of processing the window member according to an embodiment may include the operation S300 of thermoforming the glass substrate. The glass substrate BS on which the protective layer PL is formed may be processed into various shapes in the thermoforming process operation. For example, the glass substrate BS may be processed to have at least one uneven portion. In detail, the glass substrate BS may be processed to have at least one curved portion.

Figure 3A:
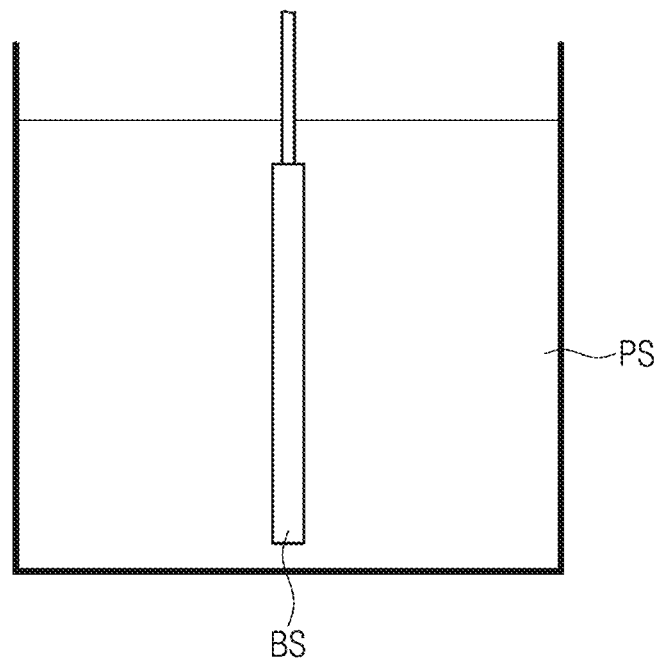
FIGS. 3A, 3B, 3C, and 3D are schematic views illustrating operations of a method of processing a window member according to an embodiment.
Figure 3B:
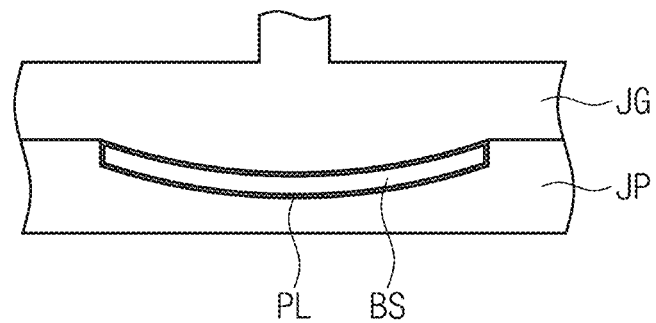

The thermoforming process may be performed by using a thermoforming jig. Referring to FIG. 3B, the glass substrate BS on which the protective layer PL is formed may be disposed between a pressing jig JG and a support plate JP and processed to have a shape corresponding to that of a groove defined in the support plate JP.

The operation S300 of thermoforming a glass substrate may be performed under a condition of a high temperature and a high pressure. For example, the operation S300 of thermoforming a glass substrate may be performed under a condition of a high temperature equal to or greater than about 700° C. and a high pressure equal to or less than about 0.6 Mpa. Meanwhile, the condition of the high temperature and the high pressure, which is used in the operation S300 of thermoforming a glass substrate, may be varied according to a material of the used glass substrate and a kind of used thermoforming equipment. For example, the temperature condition may be less than the above-described about 700° C. Also, a maximum pressure of the high pressure condition may be greater than about 0.6 Mpa. In detail, the maximum pressure condition may be equal to or greater than about 1.0 Mpa.

The method of processing the window member according to an embodiment may include the operations S100 and S150 of applying the protective coating agent PS onto the glass substrate BS to form the protective layer PL to protect the surface of the glass substrate BS during the operation S300 of thermoforming. For example, as the method of processing the window member according to an embodiment includes the operation of forming the protective layer PL on the glass substrate BS, a mold mark that may be induced by the pressing jig JG or the support plate JP under the condition of a high temperature and a high pressure may be restrained from being generated in the glass substrate BS. Accordingly, the window member WM processed by the method of processing the window member according to an embodiment may omit an additional surface polishing process for removing the mold mark after the thermoforming operation S300.

Meanwhile, the protective coating agent PS used in the method of processing the window member according to an embodiment may include a siloxane derivative including inorganic particles or an inorganic sol compound to provide the protective layer PL having thermal stability under the high temperature condition of the thermoforming operation S300.

In detail, referring to Table 1 below, it may be shown that the siloxane derivative used as the protective coating agent in the method of processing the window member according to an embodiment has excellent thermal stability even under a high temperature equal to or greater than about 700° C. Table 1 shows results of thermogravimetric analysis (TGA), in which weight loss (%) represents a weight that is thermally decomposed with respect to an initial weight by increasing a temperature to about 700° C.

TABLE 1

| Classification | Siloxane derivative embodiment | Siloxane compound | Siloxane acrylate |
|---|---|---|---|
| Weight loss (%) | 40 | 55 | 70 |

Referring to the results of Table 1, it may be shown that the siloxane derivative embodiment has a lowest value of 40% and, accordingly, has an excellent thermal resistance at a high temperature in comparison with that of the single siloxane compound or the siloxane acrylate copolymer compound.

Meanwhile, since the surface of the glass substrate BS is protected by the protective layer PL, the glass substrate BS may maintain a surface roughness and a transparency at the same level as those before the thermoforming process even after the thermoforming process is performed. Also, since the surface of the glass substrate BS is protected by the protective layer PL, the glass substrate BS has values of a haze and a yellow index at the same level as those before the thermoforming process even after the thermoforming process is performed, thereby maintaining optical characteristics even when the thermoforming process is performed under the high temperature and high pressure.

The protective layer PL disposed on the glass substrate BS during the operation S300 of thermoforming a glass substrate may be removed after the operation S300 of thermoforming process. The method of processing the window member according to an embodiment may include the operation S500 of removing the protective layer from the glass substrate after the operation S300 of thermoforming the glass substrate.

Figure 3C:
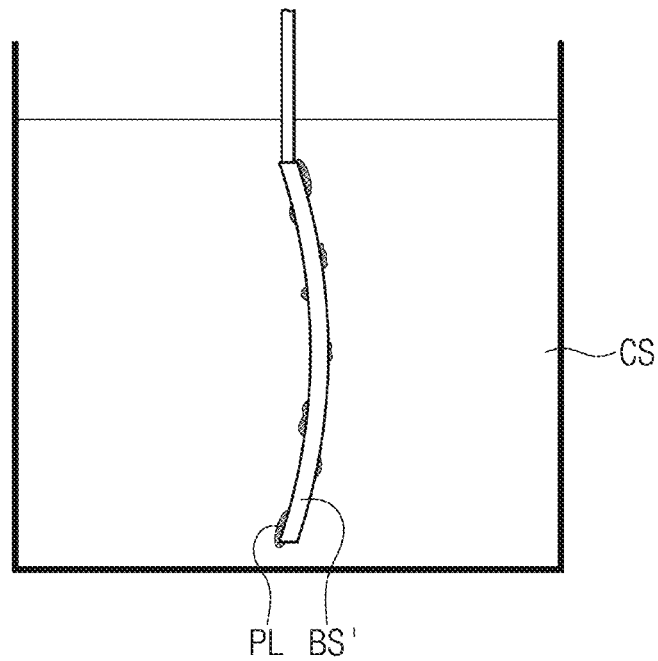

FIG. 3C is a schematic view illustrating the operation S500 of removing the protective layer from the glass substrate. A cleaning solution CS may be provided to remove the protective layer PL. FIG. 3C illustrates a method of dipping a glass substrate BS' into a cleaning solution CS to remove the protective layer PL from the thermoformed glass substrate BS'. However, an embodiment of the inventive concept is not limited to the method of providing the cleaning solution CS in FIG. 3C.

In an embodiment, the cleaning solution CS may be a strong alkaline solution. That is, the operation S500 of removing the protective layer PL may include applying the strong alkaline solution to the thermoformed glass substrate BS'. For example, the operation S500 of removing the protective layer PL may include providing a KOH solution, a NaOH solution, or a tetramethylammonium hydroxide solution to the thermoformed glass substrate BS'. The strong alkaline solution used in the operation S500 of removing the protective layer PL may have a concentration of about 20 wt % on the basis of water.

The operation S500 of removing the protective layer PL may include an operation of ultrasonic cleaning. The operation S500 of removing the protective layer PL may be a process of dipping the thermoformed glass substrate BS' into the strong alkaline solution CS to remove the protective layer PL by using an ultrasonic cleaning method. The operation S500 of removing the protective layer PL may be performed under a condition of a temperature of about 60° C. to about 70° C.

Figure 3D:
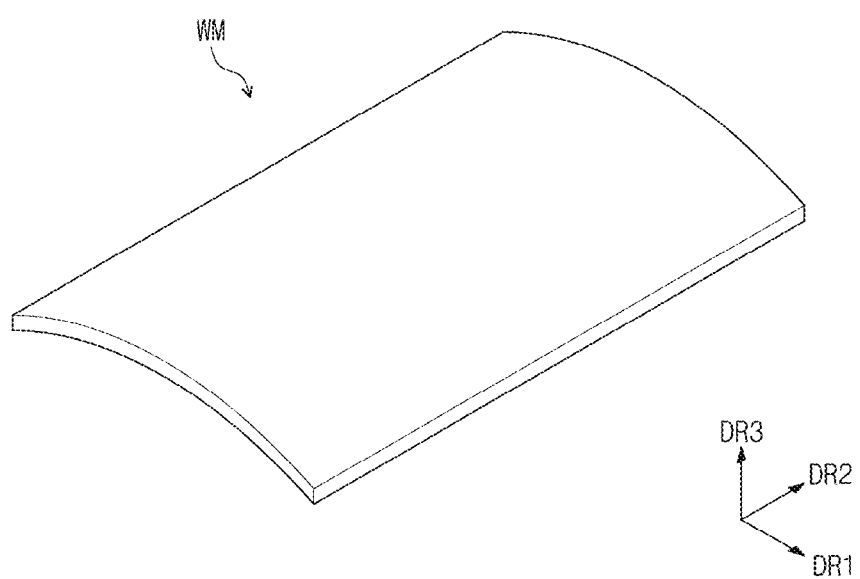

FIG. 3D illustrates the window member WM that is provided as a final shape after the operation S500 of removing the protective layer PL. The window member WM may represent a state in which the protective layer PL is removed from the thermoformed glass substrate BS'. The window member WM processed by using the method of processing the window member, which includes the operation S300 of thermoforming process, may be provided in the display apparatus DD (FIG. 1).

Meanwhile, although the window member WM has a single layer in FIG. 3D, an embodiment of the inventive concept is not limited thereto. For example, the window member WM may include at least one functional layer formed on the glass substrate. The at least one functional layer may include a hard coating layer, an anti-pollution layer, and a surface protective layer.

Also, although the shape of the window member is exemplarily illustrated in FIG. 3D, an embodiment of the inventive concept is not limited to the shape of the window member processed by using the method of processing a window member according to an embodiment in FIG. 3D.

FIGS. 4A to 4D exemplarily illustrate embodiments of the window member having various shapes. A window member WM-1 in FIG. 4A may include a non-bending area NBA and two bending areas BA1 and BA2. The two bending areas BA1 and BA2 are bent respectively from one side and the other side of the non-bending area NBA.

Figure 4A:
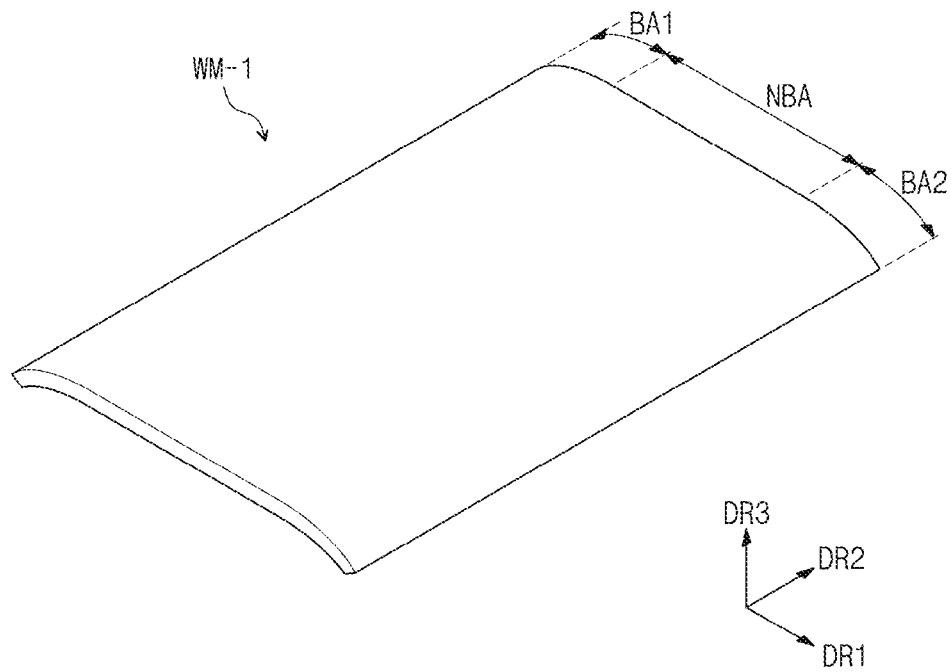
FIGS. 4A, 4B, 4C, and 4D are perspective views illustrating embodiments of a thermoformed window member.
Figure 4B:
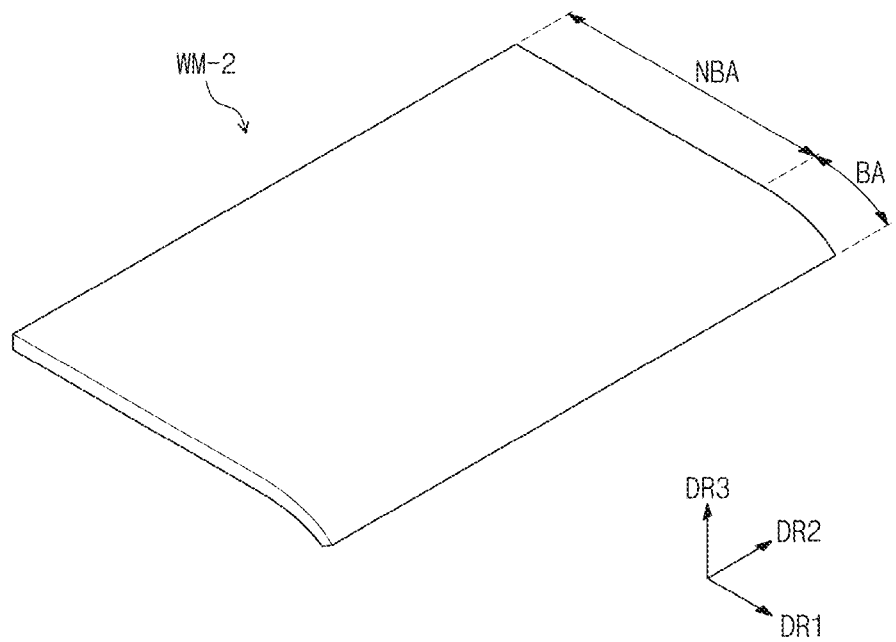
Figure 4C:
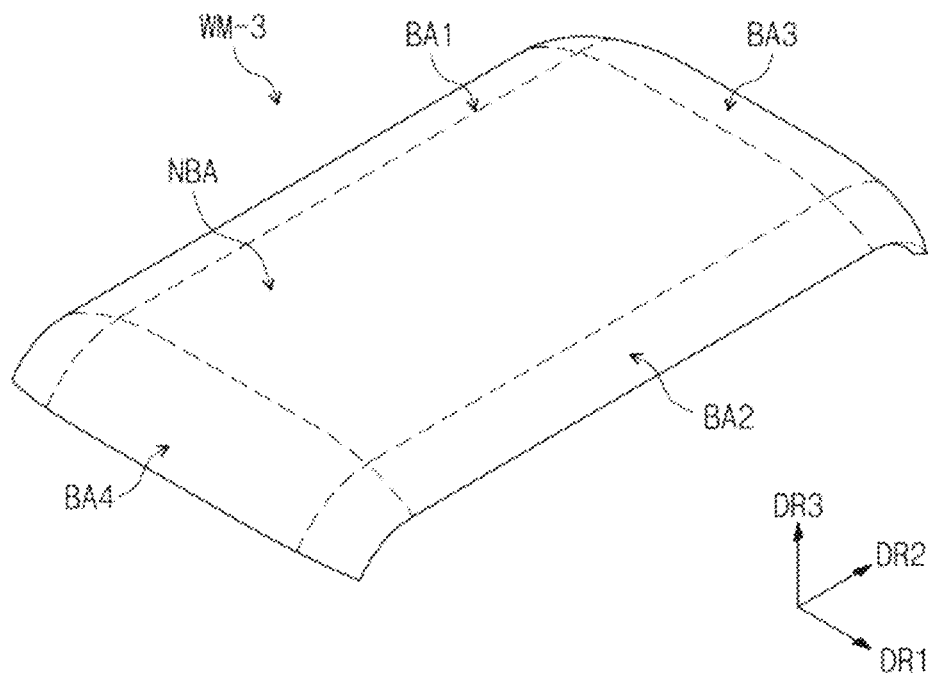

A window member WM-2 in FIG. 4B may include one bending area BA that is bent from one side of a non-bending area NBA. Also, FIG. 4C illustrates a window member WM-3 including four bending areas BA1, BA2, BA3, and BA4 bent respectively from four side surface of a non-bending area NBA. The bending areas in FIGS. 4A to 4C may be curved portions that extend from the non-bending areas and are bent.

Figure 4D:
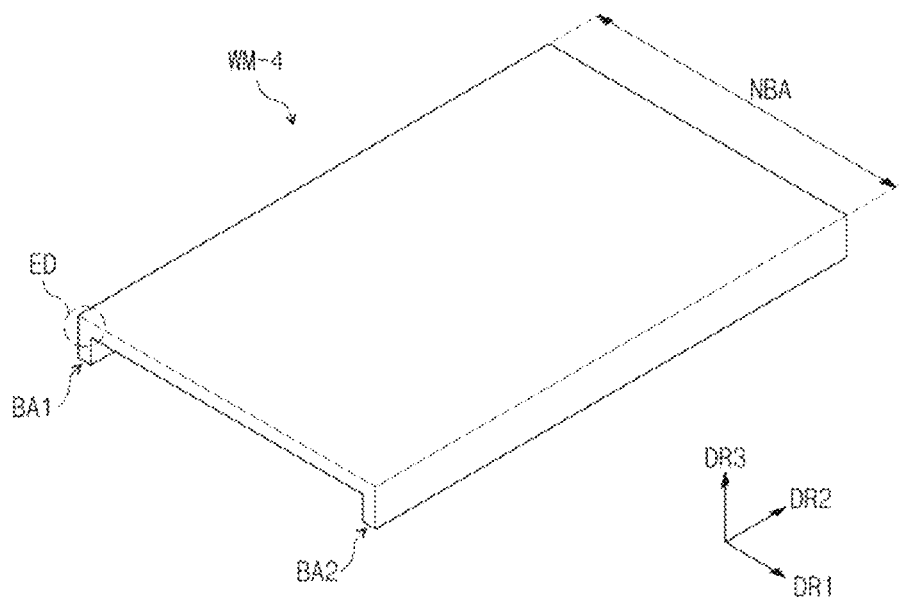

Meanwhile, in an embodiment of a window member WM-4 in FIG. 4D, bending areas BA1 and BA2 may be respectively bent from both sides of the non-bending area NBA. The bending areas BA1 and BA2 may be bent by a right angle respectively from side surfaces of the non-bending area NBA. That is, an edge ED corresponding to a boundary between the bending areas BA1 and BA2 and the non-bending area NBA may have a shape bent by a right angle.

However, although the bending areas BA1 and BA2 are bent by a right angle from the side surfaces of the non-bending area NBA in FIG. 4D, a curved portion may be provided in a portion at which the non-bending area NBA is connected to the bending areas BA1 and BA2 between the bending areas BA1 and BA2 and the non-bending area NBA. For example, the portion at which the non-bending area NBA is connected to the bending areas BA1 and BA2 may necessarily include a curved portion having a predetermined radius of curvature. In detail, a curved portion having a radius of curvature equal to or less than about 0.05 mm may be provided between the bending areas BA1 and BA2 and the non-bending area NBA. That is, the edge ED in FIG. 4D may include a curved surface having a predetermined radius of curvature.

The curved portion having a fine radius of curvature may be provided to stably form the bending areas BA1 and BA2 in a process of processing the window member WM-4. Meanwhile, the radius of curvature of the curved portion provided between the bending areas BA1 and BA2 and the non-bending area NBA is not limited to the above-described values. For example, the radius of curvature of the curved portion may be greater than about 0.05 mm.

Figure 6:
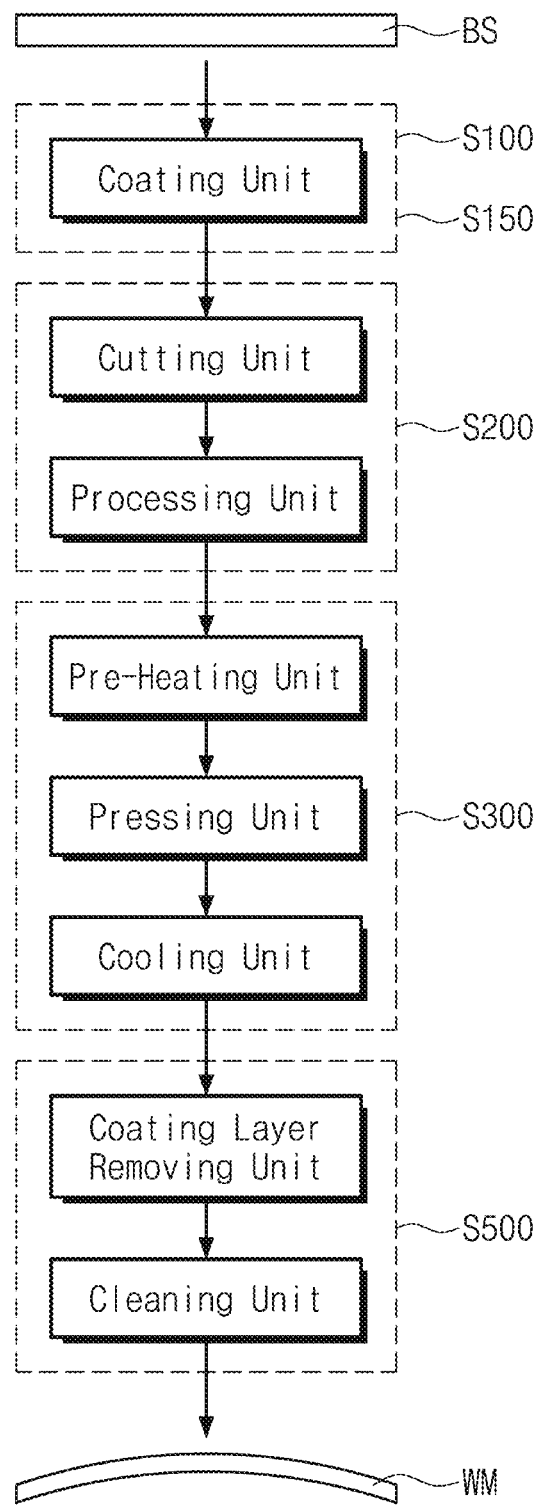
FIG. 6 is a block diagram illustrating operations of a method of processing a window member according to an embodiment.

FIG. 6 is a schematic block diagram illustrating each of the operations of the method of processing the window member according to an embodiment in FIG. 2. In FIG. 6, in correspondence to each of the operations in the flowchart in FIG. 2, each of units performing the operations is illustrated as a block. The units perform the operation S100 of applying the protective coating agent onto the glass substrate BS that is before processed, the operation S300 of thermoforming the glass substrate, and the operation S500 of removing the protective layer.

Referring to FIG. 6, the glass substrate BS is provided to a coating unit. In the coating unit, the operation S100 of applying the protective coating agent onto the glass substrate BS and the operation S150 of forming the protective layer may be performed. Meanwhile, although an additional unit is not illustrated, the coating unit may further include a curing unit that thermally cures the protective coating agent.

Meanwhile, the method of processing the window member according to an embodiment further includes an operation S200 of cutting that is performed in a cutting unit and a processing unit in FIG. 6. In the cutting unit and the processing unit, a process of cutting the glass substrate or forming a hole in the glass substrate may be performed. That is, the operation S200 of cutting may be an operation of cutting and processing a glass substrate. The operation of cutting and processing a glass substrate may be performed before the glass substrate BS is provided to the coating unit unlike the embodiment in FIG. 6. In this case, the operation S100 of applying a protective coating agent may be performed after the operation S200 of cutting a glass substrate.

The glass substrate may be sequentially provided to a pre-heating unit, a pressing unit, and a cooling unit after processed in the cutting unit and the processing unit. The pre-heating unit, the pressing unit, and the cooling unit may be blocks performing the operation S300 of thermoforming.

The glass substrate that is thermoformed through the pre-heating unit, the pressing unit, and the cooling unit may be provided to a coating layer removing unit. Thereafter, the glass substrate from which the protective layer is removed in the coating layer removing unit may be provided to a cleaning unit. The operation S500 of removing a protective layer from a glass substrate may be performed in the coating layer removing unit and the cleaning unit. After the glass substrate goes through the coating layer removing unit and the cleaning unit, the window member WM that is completely processed may be provided.

The units in which the method of processing a window member according to an embodiment in FIG. 6 may be independent units separated from each other. However, an embodiment of the inventive concept is not limited thereto. For example, the units may be connected to work together, and some of the units may be integrated with each other.

FIG. 7 is a flowchart illustrating a method of processing a window member according to an embodiment. In describing FIG. 7, contents overlapping those described previously in FIGS. 1 to 6 will not be described again, and only different points will be mainly described.

The method of processing a window member according to an embodiment in FIG. 7 includes a step S100 of applying a protective coating agent on a glass substrate, an operation S150 of thermally treating the applied protective coating agent to form a protective layer, an operation S300 of thermoforming the glass substrate, and an operation S500 of removing the protective layer from the glass substrate. The method of processing a window member according to an embodiment in FIG. 7 may further include an operation S700 of strengthening the glass substrate in comparison with the embodiment in FIG. 2. Meanwhile, in the method of processing a window member according to an embodiment in FIG. 7, regarding operations corresponding to those described previously in the flowchart of FIG. 2, the same contents as those described in FIG. 2 may be applied.

The operation S700 of strengthening a glass substrate may be an operation of providing a molten salt to strengthen the glass substrate. The operation S700 of strengthening a glass substrate may be an operation of chemically strengthening a glass substrate by using at least one strengthening molten salt selected from the group consisting of $LiNO_3$, $NaNO_3$, $KNO_3$, $Li_2SO_4$, $Na_2SO_4$, and $K_2SO_4$.

The method of processing a window member according to an embodiment may provide the protective layer before the operation of thermoforming the glass substrate to protect the glass substrate during the thermoforming process, thereby minimizing surface defects such as a mold mark and a dent. Also, the method of processing a window member according to an embodiment may include the operation of removing the protective layer after the thermoforming operation to completely remove the protective layer for protecting the glass substrate, thereby providing the window member having excellent surface characteristics and excellent optical characteristics.

Figure 8A:
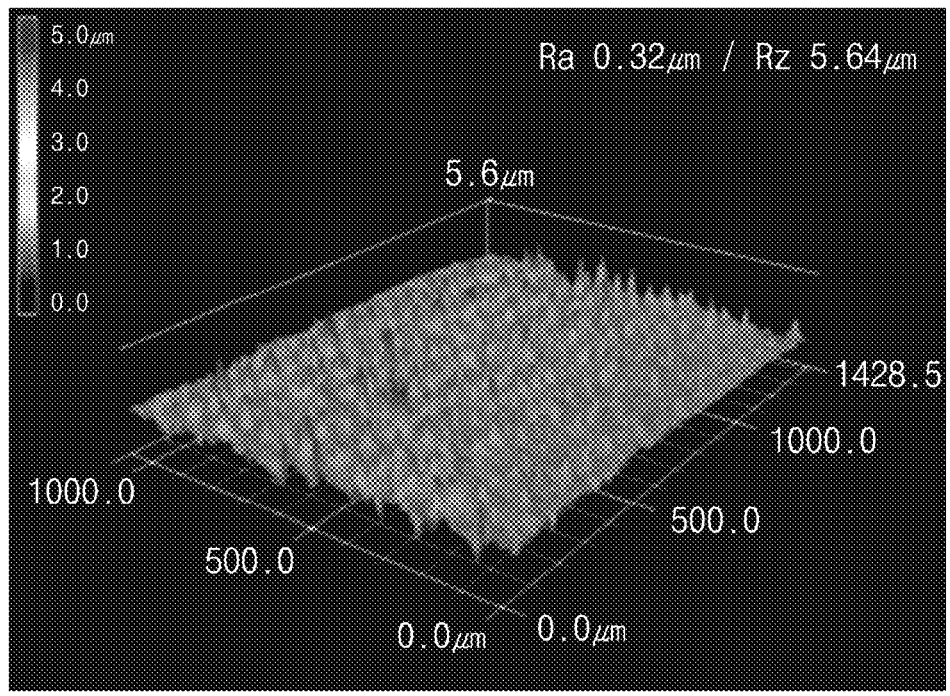
FIGS. 8A and 8B are views illustrating a surface of a window member after a thermoforming operation.
Figure 8B:
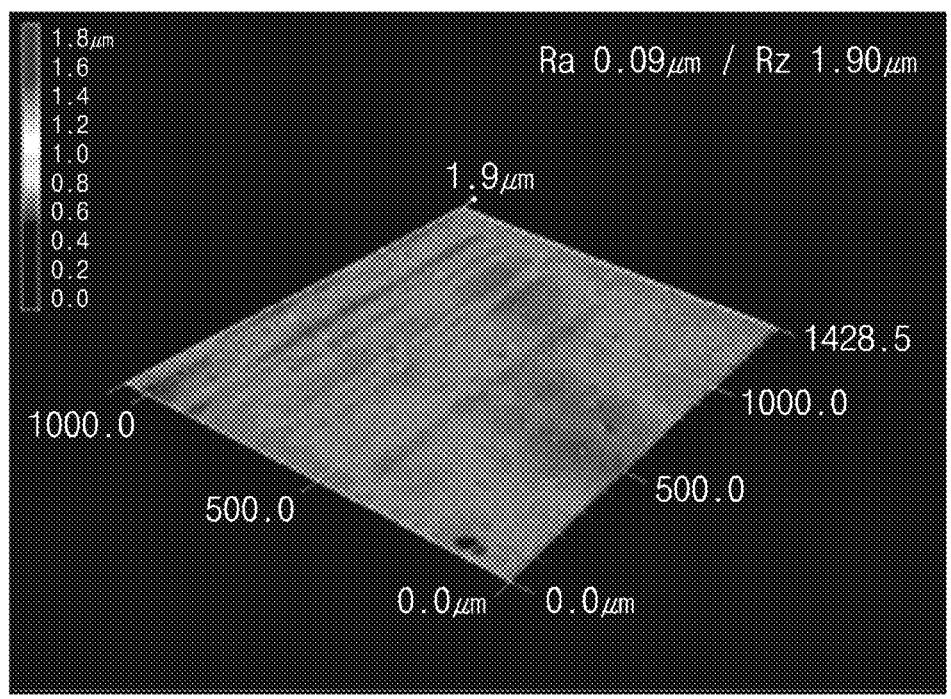

FIGS. 8A and 8B are atomic force microscope (AFM) images illustrating surfaces of window members processed by using the method of processing a window member including the thermoforming process. FIG. 8A shows a surface of a window member processed by using a typical method of processing a window member, and FIG. 8B shows the surface of the window member processed by using the method of processing a window member according to an embodiment. When FIGS. 8A and 8B are compared, the surface of the window member processed by using the method of processing a window member according to an embodiment has a more smooth surface state than that of the surface of the window member processed by using a typical method of processing a window member That is, since the method of processing a window member according to an embodiment provides the protective layer for stably protecting the surface of the glass substrate during the thermoforming process, it may be seen that deformation in the surface of the glass substrate, which is generated during the thermoforming process, is minimized.

Also, since the method of processing a window member according to an embodiment provides the protective layer formed of the protective coating agent including the siloxane compound or the inorganic sol compound, which includes inorganic particles, the glass substrate may be stably protected even under the condition of a high temperature and a high pressure.

Meanwhile, since the method of processing a window member according to an embodiment includes the operation of providing the protective layer on the glass substrate, which is provided before the thermoforming process and easily removed after the thermoforming process, an additional polishing process for relieving the surface roughness of the glass substrate may be omitted to improve productivity while processing the window member.

Table 2 shows main materials contained in the protective coating agent used in Examples 1 to 5. Also, Table 3 shows evaluation results regarding embodiments of the window member processed by using the method of processing a window member according to an example and a comparative example of the window member processed by using the typical method of processing a window member. The window members of the Examples 1 to 5 are processed by using the protective coating agent including the siloxane derivative and the inorganic sol, and the window member of the comparative example is processed by performing the thermoforming process without the protective coating agent.

Referring to Table 2, the siloxane derivative including inorganic particles are used as a main material of the protective coating agent in the embodiments 1 and 3, and the inorganic sol is used as a main material of the protective coating agent in the embodiments 2 and 4. In the embodiment 5, the protective coating agent, in which the siloxane derivative including inorganic particles and the inorganic sol are mixed at a ratio of 1:1, is used. The $SiO_2$ siloxane derivative used in the embodiment 1 is the siloxane compound including inorganic particles of $SiO_2$, and the $ZrO_2$ siloxane derivative used in the embodiment 3 is the siloxane compound including inorganic particles of $ZrO_2$.

Meanwhile, the protective coating agent used in the Examples 1 to 5 further include an acrylic resin, an organic solvent, a dispersant, and a hardener in addition to the main material described in Table 2. The protective coating agent is used in the same manner in the Examples 1 to 5.

Also, the protective coating agent used in the Examples 1 to 5 is applied to the glass substrate in a screen printing method, so that a thickness of the protective coating agent after curing is about 10 μm to about 15 μm.

TABLE 2

| Classification | Main material of protective layer |
| --- | --- |
| Example 1 | $SiO_2$ siloxane derivative |
| Example 2 | $ZrO_2$ sol |
| Example 3 | $ZrO_2$ siloxane derivative |
| Example 4 | $TiO_2$ sol |
| Example 5 | $TiO_2$ sol/$SiO_2$ siloxane derivative |

In the evaluation results in Table 3, the surface defect is obtained by observing a surface state of the glass substrate before and after the thermoforming process by naked eyes. The term "OK" for the surface defect represents a good state without defects observed by naked eyes.

The surface roughness represents a value of surface roughness of the window member after the process of processing a window member is completed. Ra and Rz are different in a method for calculating a mean value of values of surface roughness.

As the optical characteristics, haze and yellow index (YI) are evaluated. Also, the surface composition is represented by a peak matching ratio (%) that is a degree of matching between FT-IR peaks of the surface of the glass substrate before the protective coating agent is applied and the surface of the glass substrate from which the protective layer is removed after the thermoforming process is performed.

The thermal stability represents results of thermogravimetric analysis (TGA). The thermal stability represents a weight ratio of a residue amount remained after a temperature increases up to about 700° C. on the basis of an initial weight of the protective coating layer.

TABLE 3

| Classification | | Comparative example | Example 1 | Example 2 | Example 3 | Example 4 | Example 5 |
| --- | --- | --- | --- | --- | --- | --- | --- |
| Surface defect | After thermoforming process | — | OK | OK | OK | OK | OK |
| | After removing protective layer | — | OK | OK | OK | OK | OK |
| Surface roughness | Ra (μm) | 0.25 | 0.06 | 0.09 | 0.06 | 0.06 | 0.06 |
| | Rz (μm) | 6.43 | 0.68 | 1.09 | 0.74 | 0.72 | 0.70 |

TABLE 3-continued

| | Classification | Comparative example | Example 1 | Example 2 | Example 3 | Example 4 | Example 5 |
|---|---|---|---|---|---|---|---|
| Optical characteristics | Transparency (%) | 92.2 | 92.4 | 92.4 | 92.4 | 92.4 | 92.4 |
| | Haze (%) | 0.21 | 0.28 | 0.25 | 0.25 | 0.28 | 0.25 |
| | YI | 0.67 | 0.65 | 0.65 | 0.65 | 0.66 | 0.64 |
| Surface composition | Peak matching ratio (%) | — | 100 | 100 | 100 | 100 | 100 |
| Thermal stability | Residue amount (%) | | 65.5 | 68.2 | 64.9 | 67.5 | 66.1 |

Referring to the results of Table 3, the window member of the embodiment processed by using the method of processing a window member according to Examples, in which the protective layer is provided during the window member processing process to perform the thermoforming process, and then the protective layer is removed, has a satisfactory surface roughness value in comparison with that of the comparative example. That is, the method of processing a window member according to an embodiment may prevent surface defects of the glass substrate, which may be generated during the thermoforming process.

Also, the Examples have a transparency, a haze, and a yellow index (YI), which are similar to those of the comparative example that is the window member processed by using the typical method of processing a window member without using the protective layer. Even in the results of surface composition analysis, since a constituent of the protective layer remained in the surface of the window member is not detected, it may be known that the protective layer is effectively removed during the protective layer removing process.

When the residue amount after the TGA test for evaluating the thermal stability is reviewed, it may be seen that high residue amounts equal to or greater than about 65% in all of the Examples 1 to 5. That is, it may be known that the protective layer used in the Examples 1 to 5 has the high thermal stability.

That is, as the method of processing a window member according to an embodiment uses the protective coating agent including at least one of the siloxane derivative and the inorganic sol compound while the thermoforming process is performed to form the protective layer and remove the formed protective layer after the thermoforming process, the glass substrate may be effectively protected under the processing condition of a high temperature and a high pressure to provide the window member having excellent surface characteristic without the additional processing process after the thermoforming process.

The method of processing a window member according to an embodiment may include providing the protective layer formed of the protective coating agent including the siloxane derivative or the inorganic sol onto the glass substrate to protect the surface of the glass substrate even during the high-temperature thermoforming process.

The method of processing a window member according to an embodiment may provide the protective layer onto the glass substrate before the thermoforming process of the glass substrate and remove the provided protective layer after the thermoforming process, so that the additional polishing process for processing the surface of the glass substrate after the thermoforming process is omittable.

Although the exemplary embodiments have been described, it is understood that the inventive concept should not be limited to these exemplary embodiments but various changes and modifications can be made by one ordinary skilled in the art within the spirit and scope of the inventive concept as hereinafter claimed.

Hence, the protective scope of the inventive concept shall be determined by the technical scope of the accompanying claims.

What is claimed is:

1. A method of processing a window member, the method comprising:
applying a protective coating agent comprising at least one of a siloxane derivative and an inorganic sol compound onto a glass substrate;
performing a heat treatment on the applied protective coating agent to form a protective layer on the glass substrate;
thermoforming the glass substrate; and
completely removing the protective layer.

2. The method of claim 1, wherein the siloxane derivative comprises a siloxane compound and inorganic particles bonded with the siloxane compound, and
the inorganic particles comprise at least one of $TiO_2$, $SiO_2$, or $ZrO_2$.

3. The method of claim 1, wherein the inorganic sol compound comprises at least one of a $TiO_2$ sol, a $SiO_2$ sol, or a $ZrO_2$ sol.

4. The method of claim 1, wherein the protective coating agent comprises the siloxane derivative and the inorganic sol compound, and
the inorganic sol compound is contained at 50 wt % or more and 90 wt % or less on the basis of a weight of the siloxane derivative.

5. The method of claim 1, wherein the protective coating agent comprises a siloxane derivative having $SiO_2$ particles bonded thereto and a $TiO_2$ sol.

6. The method of claim 1, wherein the protective coating agent further comprises an acrylate compound.

7. The method of claim 1, wherein the applying of the protective coating agent is performed by using a method of screen printing, dip coating, spin coating, bar coating, or slot-die coating.

8. The method of claim 1, wherein the forming of the protective layer comprises thermally-curing the protective coating agent.

9. The method of claim 1, wherein the protective layer is provided on top and bottom surfaces of the glass substrate.

10. The method of claim 1, wherein the forming of the protective layer comprises forming a first sub-protective layer on the glass substrate and forming a second sub-protective layer on the first sub-protective layer, and
the first sub-protective layer and the second sub-protective layer are formed by using protective coating agents having compositions different from each other.

11. The method of claim 1, wherein the protective layer has a thickness of 10 μm or more and 30 μm or less.

12. The method of claim 1, wherein the thermoforming of the glass substrate is performed under a temperature of 700° C. or more.

13. The method of claim 12, wherein the thermoforming of the glass substrate comprises applying a pressure to the glass substrate.

14. The method of claim 1, wherein the completely removing of the protective layer is performed by applying a strong alkaline solution to the thermoformed glass substrate.

15. The method of claim 1, wherein the completely removing of the protective layer is performed by applying a KOH solution, a NaOH solution, or a tetramethylammonium hydroxide (TMAH) solution to the thermoformed glass substrate.

16. The method of claim 1, further comprising cutting the glass substrate, and
the cutting of the glass substrate is performed before the applying of the protective coating agent or after the forming of the protective layer.

17. The method of claim 1, further comprising strengthening the glass substrate after the completely removing of the protective layer.

18. A method of processing a window member, the method comprising:
applying a protective coating agent comprising at least one of a siloxane derivative and an inorganic sol compound onto a glass substrate;
thermally-curing the applied protective coating agent to form a protective layer on the glass substrate;
thermoforming the glass substrate so that the glass substrate comprise at least one curved portion; and
completely removing the protective layer.

19. The method of claim 18, wherein the siloxane derivative comprises a siloxane compound and at least one inorganic particle bonded with the siloxane compound and selected from the group consisting of $TiO_2$, $SiO_2$, or $ZrO_2$, and
the inorganic sol compound comprises at least one of a $SiO_2$ sol, a $TiO_2$ sol, or a $ZrO_2$ sol.

20. The method of claim 18, wherein the thermoforming of the glass substrate comprises applying a pressure to the glass substrate under a temperature of 700° C. or more.

* * * * *